US010571897B2

(12) United States Patent
Iisaka et al.

(10) Patent No.: US 10,571,897 B2
(45) Date of Patent: Feb. 25, 2020

(54) MANUFACTURING SYSTEM AND CONTROL METHOD OF MANUFACTURING SYSTEM

(71) Applicant: FUJI CORPORATION, Chiryu-shi (JP)

(72) Inventors: Jun Iisaka, Nissin (JP); Shingo Fujimura, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 123 days.

(21) Appl. No.: 15/737,493

(22) PCT Filed: Jun. 19, 2015

(86) PCT No.: PCT/JP2015/067687
§ 371 (c)(1),
(2) Date: Dec. 18, 2017

(87) PCT Pub. No.: WO2016/203632
PCT Pub. Date: Dec. 22, 2016

(65) Prior Publication Data
US 2019/0004501 A1  Jan. 3, 2019

(51) Int. Cl.
*G06F 19/00* (2018.01)
*G05B 19/418* (2006.01)

(52) U.S. Cl.
CPC ..... *G05B 19/4184* (2013.01); *G05B 19/4185* (2013.01); *G05B 19/41875* (2013.01);
(Continued)

(58) Field of Classification Search
CPC .......... Y02P 80/40; Y02P 90/04; Y02P 90/22; Y02P 90/28
(Continued)

(56) References Cited

U.S. PATENT DOCUMENTS 5,255,197 A * 10/1993 Iida ................. G05B 19/41835
700/108
5,699,242 A   12/1997 Togawa et al.
(Continued)

FOREIGN PATENT DOCUMENTS

JP   7-271424 A   10/1995
JP   2001-100830 A   4/2001
(Continued)

OTHER PUBLICATIONS

Extended European Search Report dated Jun. 25, 2018 in corresponding European Patent Application No. 15895652.4, 9 pages.
(Continued)

*Primary Examiner* — Md Azad
(74) *Attorney, Agent, or Firm* — Oblon, McClelland, Maier & Neustadt, L.L.P.

(57) ABSTRACT

To provide a manufacturing system that is capable of still continuing work in a case in which a failure occurs in the network connection between the centralized management apparatus and a manufacturing line and a control method of the manufacturing system. When activation of all of the work machines (a screen printer, and the like) in a manufacturing line is completed, a line management device acquires, from a centralized management apparatus, material data and control data required in one day of manufacturing of the manufacturing line. Further, in a case in which a failure in a wide area network that connects the line management device and a centralized management apparatus is detected, the line management device causes a manufacturing work of mounting boards by a work machine to be continued on the basis of the control data, and the like, corresponding to one day, which is saved in advance.

4 Claims, 6 Drawing Sheets

(52) U.S. Cl.
CPC ............. *G05B 2219/39169* (2013.01); *G05B 2219/45054* (2013.01); *Y02P 80/40* (2015.11); *Y02P 90/04* (2015.11); *Y02P 90/18* (2015.11); *Y02P 90/185* (2015.11); *Y02P 90/22* (2015.11); *Y02P 90/28* (2015.11)

(58) Field of Classification Search
USPC .......................................................... 700/96
See application file for complete search history.

(56) References Cited

U.S. PATENT DOCUMENTS

| | | | |
|---|---|---|---|
| 6,507,765 B1 | 1/2003 | Hopkins et al. | |
| 2003/0014139 A1* | 1/2003 | Yokomori | G05B 19/41865 700/96 |
| 2009/0099678 A1* | 4/2009 | Kurata | G05B 19/41865 700/106 |
| 2016/0116898 A1* | 4/2016 | Iwata | G05B 19/41865 700/117 |
| 2016/0170407 A1* | 6/2016 | Nakazono | G05B 19/41865 700/99 |
| 2016/0306343 A1* | 10/2016 | Nakamura | G05B 19/418 |

FOREIGN PATENT DOCUMENTS

| | | |
|---|---|---|
| JP | 2001-142966 A | 5/2001 |
| JP | 2007-257010 A | 10/2007 |
| JP | 2009-135177 A | 6/2009 |
| JP | 2015-5062 A | 1/2015 |
| KR | 10-2013-0133579 A | 12/2013 |

OTHER PUBLICATIONS

International Search Report dated Jul. 14, 2015 in PCT/JP2015/067687 filed Jun. 19, 2015.

* cited by examiner

MANUFACTURING SYSTEM AND CONTROL METHOD OF MANUFACTURING SYSTEM

TECHNICAL FIELD

The present application relates to a manufacturing system that manages multiple manufacturing lines by using a centralized management apparatus and a control method of the manufacturing system.

BACKGROUND ART

In the related art, there is a manufacturing system in which component mounting apparatuses are provided in multiple manufacturing lines, and control data for controlling the component mounting apparatuses, is managed by a single centralized management apparatus (for example, refer to PTL 1, or the like). In the manufacturing system disclosed in PTL 1, in a case in which control data in a component mounting apparatus disposed in an arbitrary manufacturing line is altered, the altered content of the data is reported to the centralized management apparatus (referred to as an "overall management apparatus" in the document) via a line management device that manages the manufacturing lines. The centralized management apparatus transfers the altered content of the control data for which a report is received, to the line management devices and component mounting apparatuses of other manufacturing lines. In this kind of manufacturing system, in addition to control data, centralized management by using a centralized management apparatus can also be considered for various information such as material data, production planning data, and quality data.

CITATION LIST

Patent Literature

PTL 1: JP-A-2009-135177

SUMMARY

Technical Problem

However, in the above-mentioned manufacturing system, in a case in which a failure occurs in the network connection between the centralized management apparatus and a manufacturing line, there is a concern that, for example, the line management devices, and the like, will not be able to download required control data from the centralized management apparatus, and that production will stop.

The present disclosure has been devised in the light of the above-mentioned problem, and an object thereof is to provide a manufacturing system that is capable of still continuing work in a case in which a failure occurs in the network connection between the centralized management apparatus and a manufacturing line and a control method of the manufacturing system.

Solution to Problem

A manufacturing system according to the technique disclosed in the present application, which was devised in the light of the above-mentioned problem, is provided with a work machine that implements work on a workpiece to be conveyed on a manufacturing line, a line management device that is connected to the work machine via a first network, saves control data for controlling the work machine, and transmits the control data to the work machine via the first network, and a centralized management apparatus that is connected to the line management device via a second network and manages the line management device. The line management device performs a control data acquisition process of acquiring, from the centralized management apparatus, multiple items of control data corresponding to multiple types of the workpieces, and a work continuance process of causing work of the work machine on the workpiece to be continued on the basis of each of the multiple items of control data acquired from the centralized management apparatus in a case in which a failure in the second network is detected.

In the manufacturing system, the line management device acquires control data corresponding to multiple types of workpieces from the centralized management apparatus in advance. Further, in a case in which a failure in the second network is detected, the line management device causes work of the work machine to be continued on the basis of the control data corresponding to the multiple types of workpieces acquired in advance. As a result of this, in the manufacturing system, in a case in which there is a communication failure such as disconnection of the second network, it is possible to supply control data to work machines in the same manufacturing line and continue a production work by using a line management device provided in the manufacturing line.

In addition, in the manufacturing system according to the technique disclosed in the present application, the work machine generates quality data in accordance with implementation of the work on the workpiece. The line management device acquires the quality data of the work machine via the first network and transmits the quality data to the centralized management apparatus via the second network. In addition, the line management device temporarily saves the quality data in a case in which a failure in the second network is detected.

The quality data referred to in this instance, is, for example, data relating to traceability information or errors during manufacturing. As a result of such quality data being collectively managed in the centralized management apparatus, for example, it is possible to make the quality of products produced in multiple manufacturing lines uniform, or to improve the quality. However, in a case in which a failure occurs in the second network between the centralized management apparatus and the line management device, it is not possible to transmit quality data to the centralized management apparatus from the line management device, and therefore, it is difficult to update data to be collectively managed in the centralized management apparatus. In contrast to this, in a case in which a disturbance in the second network is detected, as a result of temporarily saving the quality data, for example, after repair of the second network, it is possible for the line management device to report, to the centralized management apparatus, that there is quality data that was saved during the occurrence of the disturbance, or to handle sending of the saved quality data to the centralized management apparatus, or the like.

In addition, in the manufacturing system according to the technique disclosed in the present application, in a case in which repair of a failure in the second network is detected, the line management device transmits temporarily saved quality data to the centralized management apparatus. In addition, the line management device determines whether or not transmission of quality data is completed.

In the manufacturing system, after repair of the second network, the line management device transmits quality data accumulated during a failure with the centralized management apparatus. In addition, the line management device performs a process that determines whether or not transmission to the centralized management apparatus is completed. As a result of this, it is possible to more reliably save quality data generated during the occurrence of a failure in the second network in the centralized management apparatus. In addition, for example, in a case in which the line management device of an arbitrary manufacturing line uploads quality data and the centralized management apparatus rejects uploading of quality data from another line management device in order to implement exclusive control of a database of quality data, is the other line management device can implement another process, such as a local process on a work machine via the first network, due to it not being possible to complete transmission of the quality data.

In addition, in the manufacturing system according to the technique disclosed in the present application, in a case in which a failure in the second network is detected, the line management device disconnects communication with the centralized management apparatus via the second network.

In the manufacturing system, for example, in a case in which a failure in the second network is detected in the midst of transmitting data with the centralized management apparatus, the line management device can perform a process that closes a communication port used in order to receive data from the centralized management apparatus, or the like, and prevent unintended data from being received via the second network. As a result of this, the line management device can transmit control data acquired in advance to a work machine and suitably continue a manufacturing work until it is possible to detect repair of the second network.

In addition, the technique disclosed in the present application, is not limited to a manufacturing system, and can also be applied to a control method that controls a manufacturing system.

Advantageous Effects

According to the technique disclosed in the present application, it is still possible to continue work in a case in which a failure occurs in the network connection between the centralized management apparatus and a manufacturing line.

DESCRIPTION OF EMBODIMENTS (Configuration of Mounting Board Manufacturing System 10)

Figure 1:
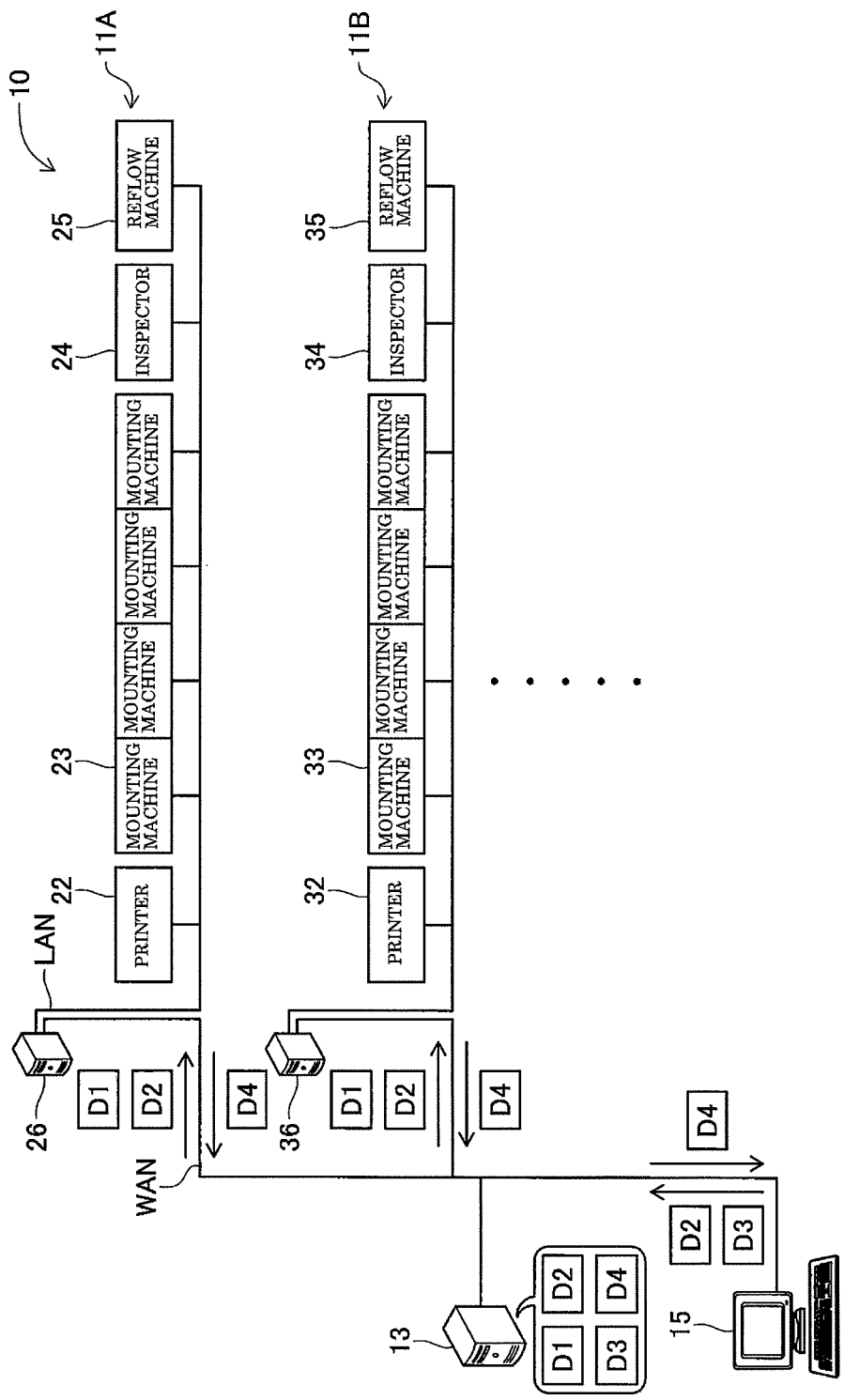
FIG. 1 is a view that shows a configuration of a mounting board manufacturing system of an embodiment.

Hereinafter, an embodiment of the present disclosure will be described with reference to the drawings. FIG. 1 shows a configuration of a mounting board manufacturing system (hereinafter, referred to as a "manufacturing system") 10, which is an embodiment of the manufacturing system of the present disclosure. As shown in FIG. 1, the manufacturing system 10 is provided with a plurality (only two are illustrated in FIG. 1) of manufacturing lines 11A and 11B, a centralized management apparatus 13, and a central management terminal 15.

The manufacturing line 11A is constituted by a screen printer 22, multiple mounting machines 23, an inspector 24, and a reflow machine 25, and is managed by a line management device 26. In the same manner, the manufacturing line 11B is constituted by a screen printer 32, multiple mounting machines 33, an inspector 34, and a reflow machine 35, and is managed by a line management device 36. Additionally, in the following description, among the manufacturing lines 11A and 11B, description will be given focusing on the manufacturing line 11A. In addition, since the manufacturing line 11B has a similar configuration to that of the manufacturing line 11A, the description thereof will be omitted as appropriate.

For example, the screen printer 22 causes a squeegee to move along a mask by using a squeegee moving device, and prints a solder paste on a circuit board, such as a printed wiring board, that passes through a through hole of the mask and is conveyed on the manufacturing line 11A. In addition, for example, the multiple mounting machines 23 mount electronic components on circuit boards. For example, the respective multiple mounting machines 23 perform a component mounting work on circuit boards conveyed on the manufacturing line 11A by sharing the work in accordance with the type, or the like, of electronic component. For example, the inspector 24 performs work that inspects a mounting state, such as a mounting position or electrical characteristics, of an electronic component mounted on a circuit board. The reflow machine 25 performs work that electrically bonds a circuit board and an electronic component by carrying out a heat treatment on the circuit board and melting and solidifying solder paste printed by the screen printer 22. Additionally, the number, type, arrangement order, and the like of the devices (the screen printer 22, the mounting machine 23, and the like) that the manufacturing line 11A shown in FIG. 1 is provided with, are merely examples, and are not limited to this configuration.

For example, the line management device 26 is a server device for management that is developed by a manufacturer of a work machine such as the screen printer 22, and the like. A user can manage the manufacturing line 11A configured by the screen printer 22, and the like, by manipulating the line management device 26. Although the details will be mentioned later, the line management device 26 manages various data used by the manufacturing line 11A and various information to be sent to the centralized management apparatus 13. The line management device 26 is respectively connected to a wide area network WAN to which the centralized management apparatus 13 is connected, and a local network LAN to which the screen printer 22, and the like, is connected.

The line management device 26, the screen printer 22, the mounting machines 23, the inspector 24, and the reflow machine 25 are mutually connected via the local network LAN. For example, the line management device 26, the screen printer 22, and the like, mutually perform sending and receiving of data through the local network LAN by using communication based on a unique communication protocol defined by a manufacturer of the mounting machines 23, or the like. For example, the unique communication protocol of the manufacturer is a protocol in which sending and receiving of data using TCP/IP protocols is possible.

For example, the centralized management apparatus 13 is a server that is located in a data center of a manufacturing company that manufactures mounting boards by using the manufacturing system 10, and integrally manages data of the manufacturing lines 11A and 11B provided in factories in remote locations. The centralized management apparatus 13 is connected to the line management devices 26 and 36, and the like, via the wide area network WAN. For example, the centralized management apparatus 13 performs sending and receiving of data with the line management device 26 through an Internet connection by using a secure communication protocol.

Additionally, the network configuration shown in FIG. 1 is merely an example, and can be altered as appropriate. For example, the centralized management apparatus 13 and the line management device 26 may be mutually connected by a local network. For example, a centralized management apparatus 13 located in a management building and a line management device 26 located in a factory at the same site may be connected by a local network.

For example, material data D1, control data D2, production planning data D3, and quality data D4 are saved in the centralized management apparatus 13. For example, the material data D1 is information of circuit boards used in manufacturing lines 11A and 11B and combined information of feeders that supply electronic components, and the like.

The control data D2 is data used in control for manufacturing mounting boards by controlling work machines such as the screen printer 22, the mounting machines 23, the inspector 24, and the reflow machine 25. More specifically, the control data D2 that controls the screen printer 22, is positional information for matching the positions of a mask and a circuit board, and information related to the size of the printing pressure with which a squeegee presses against a mask, the speed at which the squeegee is moved, or the like. The control data D2 of the mounting machines 23 is information relating to a mounting position of an electronic component on a circuit board, a type of electronic component to be mounted, a position of a feeder to be supplied, or the like. The control data D2 of the mounting machines 23 is associated with the material data D1 relating to a circuit board or an electronic component. The control data D2 of the inspector is positional information on a circuit board at which to perform inspection and information for processing image data captured for the purpose of inspection. The control data D2 of the reflow machine 25 is information required in temperature control, or the like.

For example, the production planning data D3 is data in which a manufacturing start time of a mounting board, a scheduled end time, a sequence for manufacturing, the control data D2 to be used, and a production plan such as the manufacturing lines 11A and 11B to be activated, are defined.

For example, the quality data D4 is data relating to traceability information of a circuit board, an electronic component, or the like, or errors during manufacturing. More specifically, for example, the quality data D4 is a correction amount that shows the actual extent of correction that the mounting machines 23 have implemented at a coordinate position set in the control data D2 during mounting of an electronic component. Alternatively, for example, the quality data D4 is data that shows a relationship, or the like, between serial numbers such as indicating which electronic component is mounted to which circuit board. Alternatively, for example, the quality data D4 is error information generated during manufacturing of a mounting board.

The central management terminal 15 is connected to the wide area network WAN, and for example, is located at a head office of a manufacturing company that manufactures mounting boards by using the manufacturing system 10. For example, a user at the head office manipulates the central management terminal 15 and creates the control data D2 and the production planning data D3, and sends the control data D2 and the production planning data D3 to the centralized management apparatus 13 via the wide area network WAN. For example, the centralized management apparatus 13 sends control data D2 with which material data D1 is associated to each of the line management devices 26 and 36 of each manufacturing line 11A and 11B in accordance with the production planning data D3. For example, the centralized management apparatus 13 sends, every day, an amount of the material data D1 and the control data D2 required for one day of manufacturing to match an activation time of the manufacturing lines 11A and 11B.

Meanwhile, for example, when the quality data D4 is received from the mounting machines 23, or the like, during manufacturing of mounting boards, the line management devices 26 and 36 send the quality data D4 to the centralized management apparatus 13 for each instance of reception. For example, a user at the head office can check the occurrence state, or the like, of an error of the manufacturing lines 11A and 11B by manipulating the central management terminal 15 and checking the quality data D4 saved in the centralized management apparatus 13.

(Configuration of Line Management Device 26)

Figure 2:
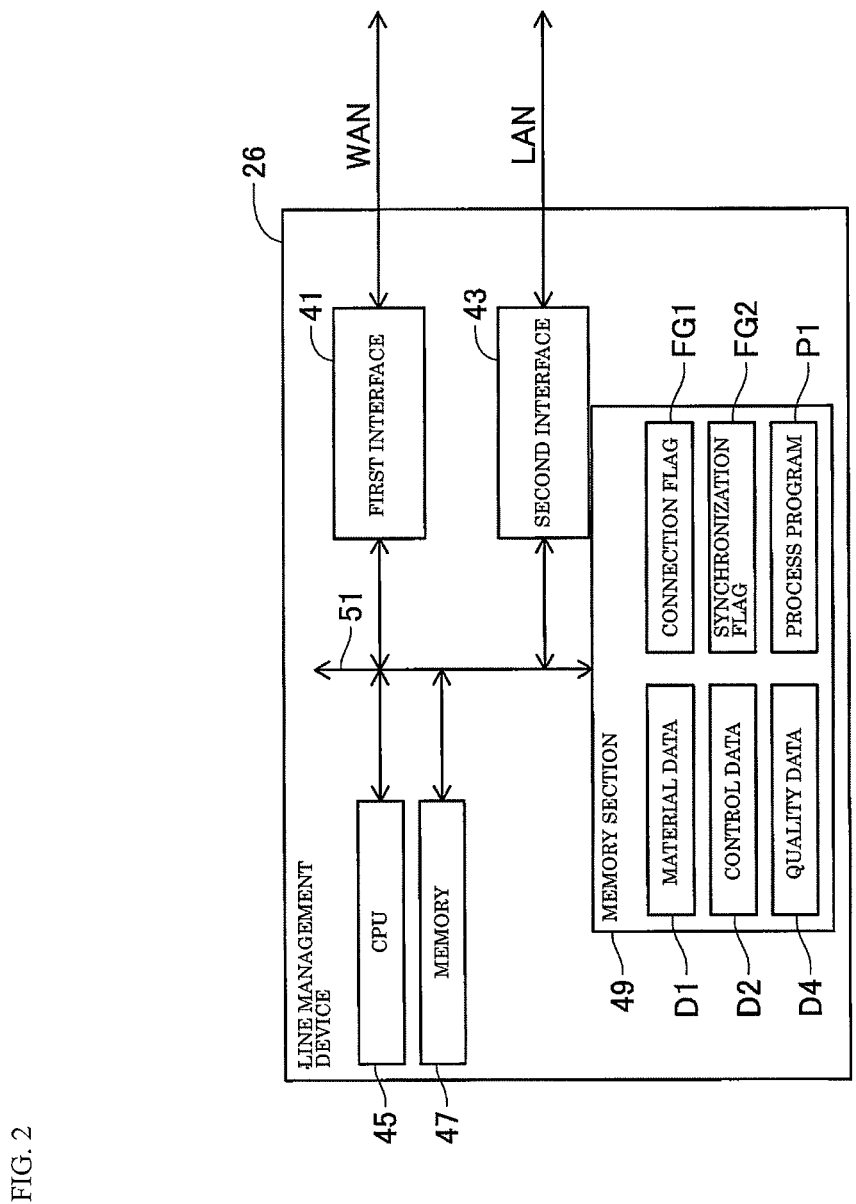
FIG. 2 is a block diagram that shows a configuration of a line management device.

Next, a configuration of the line management device 26 will be described. Additionally, since the configuration of the line management device 36 is similar to the configuration of the line management device 26, description thereof will be omitted. FIG. 2 shows a section of a configuration of the line management device 26, and shows portions relating to the present application. As shown in FIG. 2, the line management device 26 is provided with a first interface 41, a second interface 43, a CPU 45, a memory 47, and a memory section 49, and these devices are mutually connected via an internal bus 51.

The first interface 41 is connected to the wide area network WAN. The second interface 43 is connected to the local network LAN. The CPU 45 performs various functions by performing a process program P1 stored in the memory section 49, and for example, performs the above-mentioned sending and receiving of data with the centralized management apparatus 13, the screen printer 22, and the like. For example, the memory 47 is RAM, and is work memory that is used in the execution of the process program P1 by the CPU 45, or the like. For example, the memory section 49 is a storage device provided with a ROM, hard disk, and the like. For example, the above-mentioned material data D1, control data D2, and quality data D4 are saved in the memory section 49. In addition, although the details will be mentioned later, a value of a connection flag FG1, which shows the presence or absence of the connection of the wide area network WAN to the centralized management apparatus 13, is saved in the memory section 49. In addition, a value of a synchronization flag FG2, which shows whether or not data required in a synchronization process with data of the centralized management apparatus 13 is saved in the memory section 49, is saved in the memory section 49.

Figure 3:
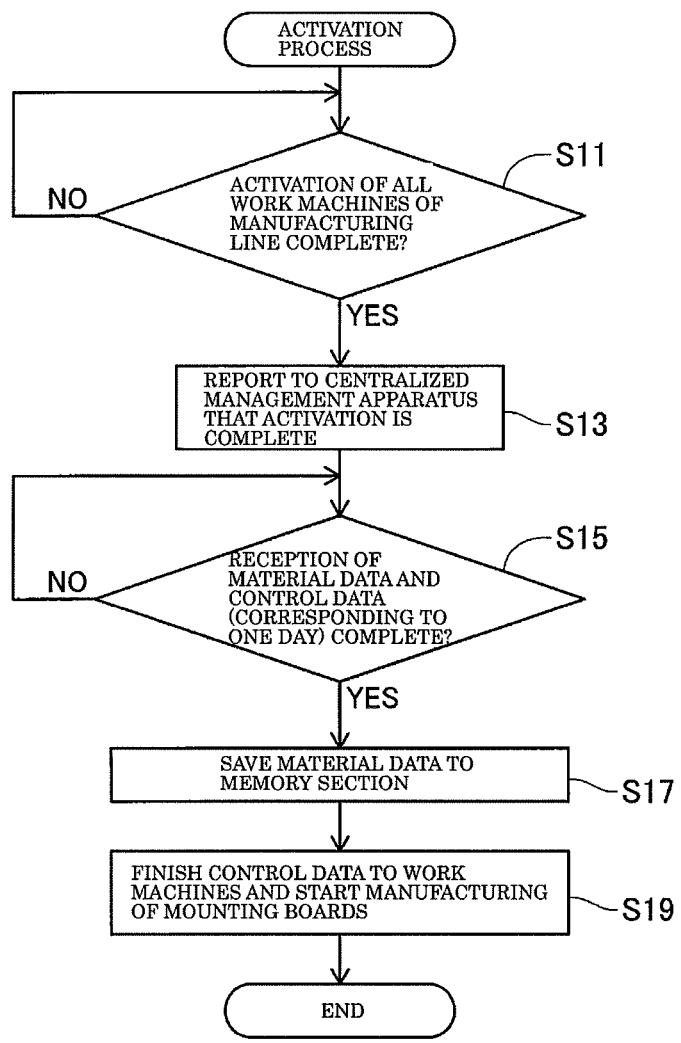
FIG. 3 is a flowchart that shows an activation process by the line management device.

Next, an action of the line management device 26 during activation of the manufacturing line 11A will be described with reference to FIG. 3. Additionally, since the action of the line management device 36 is similar to that of the line management device 26, description thereof will be omitted. In Step (hereinafter, simply referred to as "S") 11 of FIG. 3, for example, when a power supply is activated by a user of a factory, the CPU 45 of the line management device 26 performs the process program P1 (refer to FIG. 2), and determines whether or not activation of all of the work machines (the screen printer 22, and the like) of the manufacturing line 11A is completed. The CPU 45 repeats the process of S11 until the activation of all of the work machines is completed (S11: NO).

For example, a user that works at the factory turns on an activation switch of the screen printer 22 in order to start production. When initial settings are performed and activation is completed, the screen printer 22 reports this fact to the line management device 26 via the local network LAN. When completion of the activation of all of the work machines (the screen printer 22, and the like) of the manufacturing line 11A is detected (S11: YES), the CPU 45 reports, to the centralized management apparatus 13, indicating that the manufacturing line 11A is in a state in which it is possible to start manufacturing (S13). The centralized management apparatus 13 responds to the report from the line management device 26, and sends the material data D1 and the control data D2 required in one day of manufacturing of the manufacturing line 11A to the line management device 26 in accordance with the production planning data D3. For example, together with the material data D1 and the control data D2, the centralized management apparatus 13 sends data such as an order in which to implement the control data D2 and a time to start manufacturing to the line management device 26. Additionally, the data to be transmitted to the line management device 26 from the centralized management apparatus 13 is not limited to being an amount corresponding to one day, and may be an amount corresponding to multiple days.

Next, the CPU 45 determines whether or not reception of the material data D1, and the like, corresponding to one day from the centralized management apparatus 13 is completed (S15). The CPU 45 repeats the process of S15 until the reception is completed (S15: NO).

When the material data D1, and the like, corresponding to one day is received (S15: YES), the CPU 45 saves the received material data D1, and the like, in the memory section 49 (S17). The CPU 45 sends the control data D2, and the like, to the screen printer 22, and the like, of the manufacturing line 11A on the basis of the order in which to perform implementation that was reported from the centralized management apparatus 13. The screen printer 22, and the like, start manufacturing on the basis of the control data D2, and the like, received from the line management device 26 (S19). Manufacturing of mounting boards in the manufacturing lines 11A and 11B is started in this manner.

(Communication Confirmation Process)

Next, a process that the CPU 45 of the line management device 26 performs in a case in which a failure occurs in the wide area network WAN during manufacturing of mounting board will be described. Firstly, a communication confirmation process in which the CPU 45 checks the connection with the centralized management apparatus 13 via the wide area network WAN will be described with reference to FIG. 4. When the activation process shown in FIG. 3 is performed and the manufacturing of mounting boards is started, the CPU 45 performs the communication confirmation process shown in FIG. 4, and continues a manufacturing work while checking the connection with the centralized management apparatus 13 at regular intervals.

Figure 4:
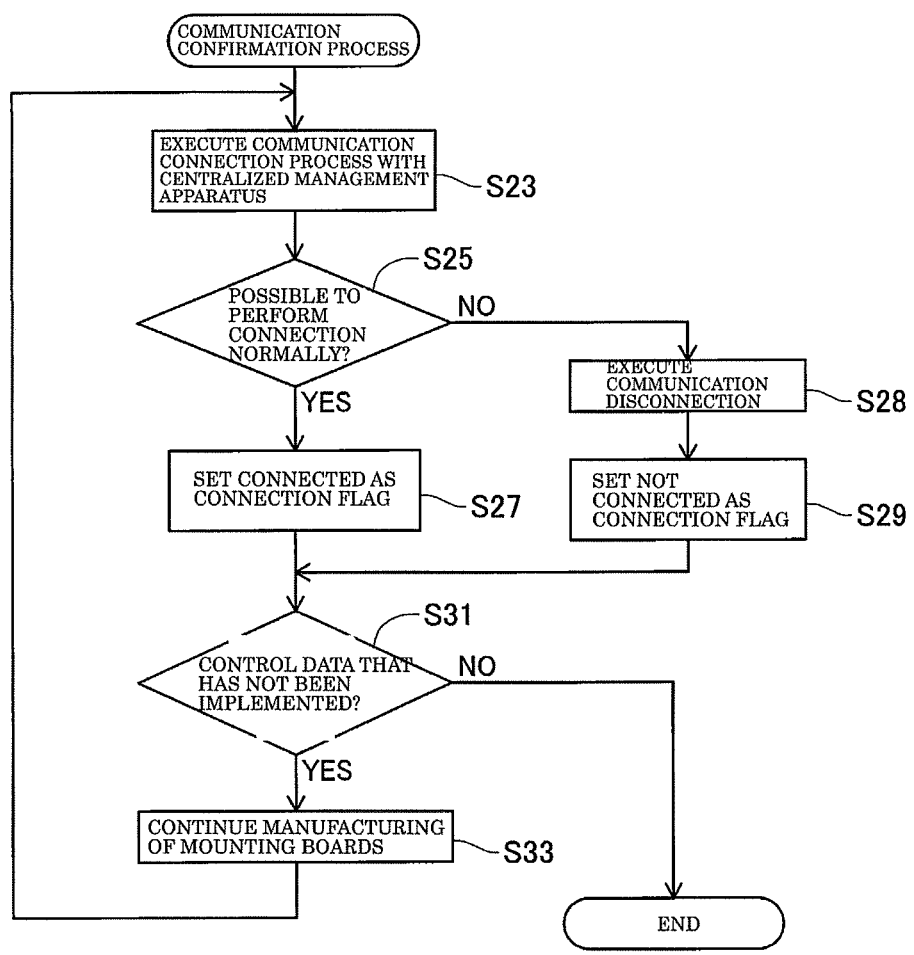
FIG. 4 is a flowchart that shows a communication confirmation process by the line management device.

Firstly, in S23 shown in FIG. 4, the line management device 26 starts a process that checks the connection of communication with the centralized management apparatus 13. For example, the CPU 45 performs communication (keep-alive) that sends confirmation data to the centralized management apparatus 13 in order to confirm that the connection with the centralized management apparatus 13 via the wide area network WAN is effective.

The CPU 45 determines whether or not it is possible for communication with the centralized management apparatus 13 to be established normally (S25). When it is determined that it is possible for communication with the centralized management apparatus 13 to be established normally (S25: YES), for example, the CPU 45 sets a value that shows that the connection with the centralized management apparatus 13 is effective as the connection flag FG1 saved in the memory section 49 (refer to FIG. 2) (S27).

Meanwhile, when it is determined that it is not possible for communication with the centralized management apparatus 13 to be established normally (S25: NO), the CPU 45 performs a process of disconnecting communication such as closing a communication port used in communication with the centralized management apparatus 13 (S28). For example, in a case in which a communication failure occurs in the wide area network WAN, the CPU 45 determines that the connection with the centralized management apparatus 13 is disconnected as a result of there not being a response from the centralized management apparatus 13 to keep-alive data (S25: NO). The CPU 45 sets a value that shows that the connection with the centralized management apparatus 13 is not connected as the connection flag FG1 saved in the memory section 49 (S29).

After performing either S27 or S29, the CPU 45 determines whether or not there is control data D2 saved in the memory section 49 that has not been implemented (S31). If all of the control data D2 corresponding to one day that was acquired from the centralized management apparatus 13 has been performed (S31: NO), the CPU 45 finishes the process shown in FIG. 4. Meanwhile, in a case in which there is control data D2 that has not been implemented, the CPU 45 continues the manufacturing of mounting boards in the manufacturing line 11A (S33). Next, the CPU 45 performs the processes from S23 again in order to check that a communication failure is not occurring in the wide area network WAN while the manufacturing of mounting boards continues.

(Quality Data Saving Process)

Next, a quality data saving process that the CPU 45 performs will be described with reference to FIGS. 5 and 6. The CPU 45 performs the quality data saving process shown in FIGS. 5 and 6 in parallel to the communication confirmation process shown in FIG. 4.

Figure 5:
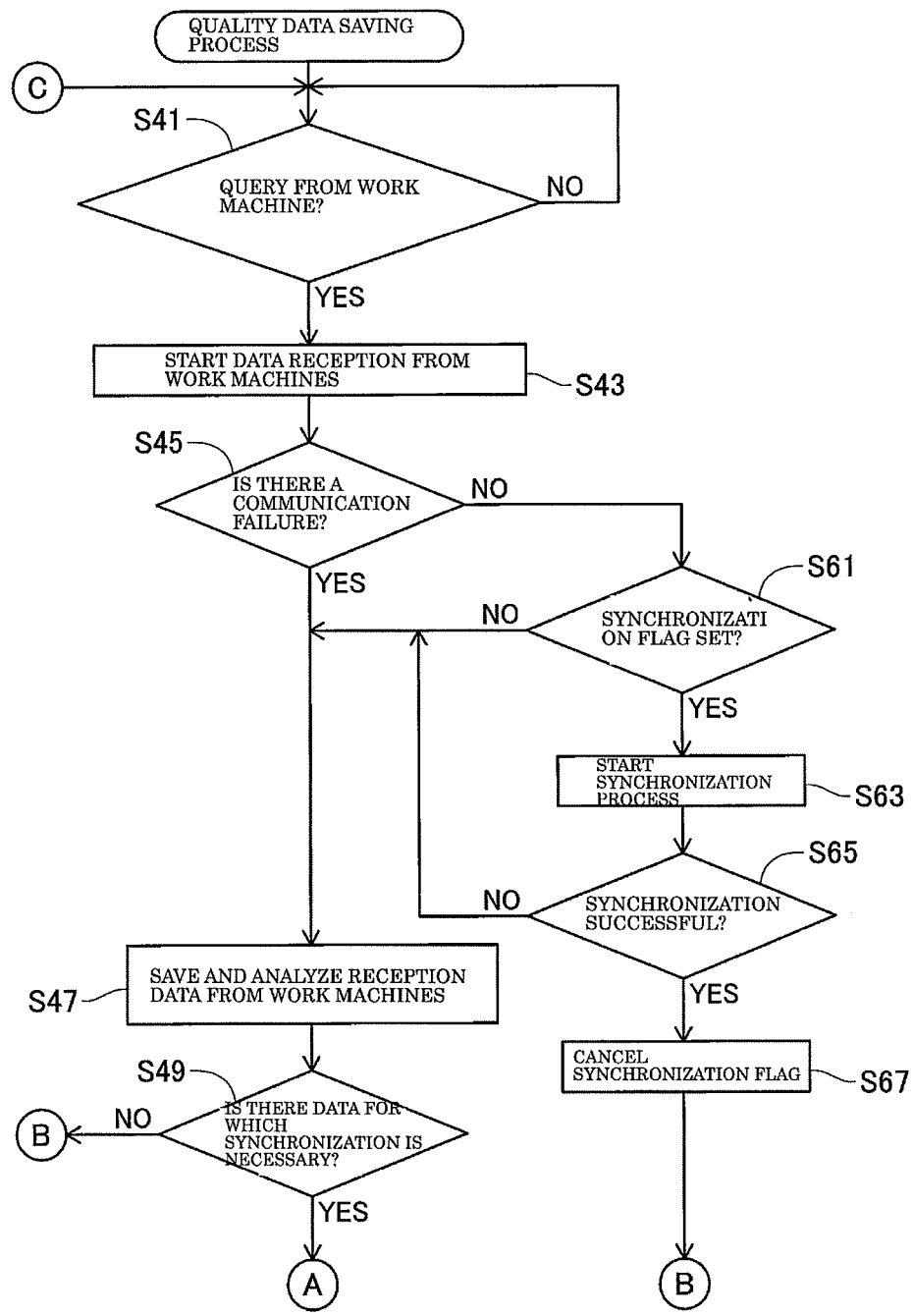
FIG. 5 is a flowchart that shows a quality data saving process by the line management device.

In S41 of FIG. 5, the CPU 45 determines whether or not there is a query, from the work machines (the mounting machine 23, and the like) of the manufacturing line 11A, indicating that the sending and receiving of data is desired. The CPU 45 repeats the process of S41 at regular intervals until there is a query (S41: NO).

In a case in which there is a query from a work machine (S41: YES), the CPU 45 starts a process that receives data from the work machine (S43). Next, the CPU 45 determines whether or not there is a failure in the communication of the wide area network WAN on the basis of the connection flag FG1 (S45). In a case in which it is determined that a communication failure has occurred (S45: YES), since upload of the quality data D4, or the like, to the centralized management apparatus 13 is not possible, the CPU 45 performs processes that can be implemented locally.

The CPU 45 saves data received from a work machine in the memory section 49, and analyzes the content of the data (S47). The CPU 45 determines whether or not it is necessary to update and synchronize the database of the centralized management apparatus 13 with the data received from the work machine (S49).

For example, since it is necessary for quality data D4 relating to traceability information of a circuit board, or the like, or an error during manufacturing to be reflected in the database of the centralized management apparatus 13 and for a user that manipulates the central management terminal 15 of the head office to be able to refer to the quality data D4, the quality data D4 is data for which a synchronization process is required. In a case in which it is determined that the data is data for which a synchronization process is required (S49: YES), the CPU 45 sets a value that shows that there is data to be synchronized as the synchronization flag FG2 saved in the memory section 49 (S51 in FIG. 6). Next, the CPU 45 responds, to a work machine from which there was a query, indicating that a process on the reception data is completed (S53).

Meanwhile, in S49 in FIG. 5, in a case in which it is determined that the data is not data for which a synchronization process is required (S49: NO), the CPU 45 performs a process that corresponds to the reception data, and performs a response to a work machine for which there was a query (S53 in FIG. 6). For example, data that queries whether or not a tape feeder with which the mounting machines 23 are filled and a slot number connected to the tape feeder are consistent with data set in the control data D2 is data that can be processed in the line management device 26 and for which a synchronization process with the centralized management apparatus 13 is unnecessary. In this case, in S53, the CPU 45 responds, to a work machine from which there was a query, indicating that consistency was achieved, indicating that there is a mistake in the connected slot, or the like (S53).

Figure 6:
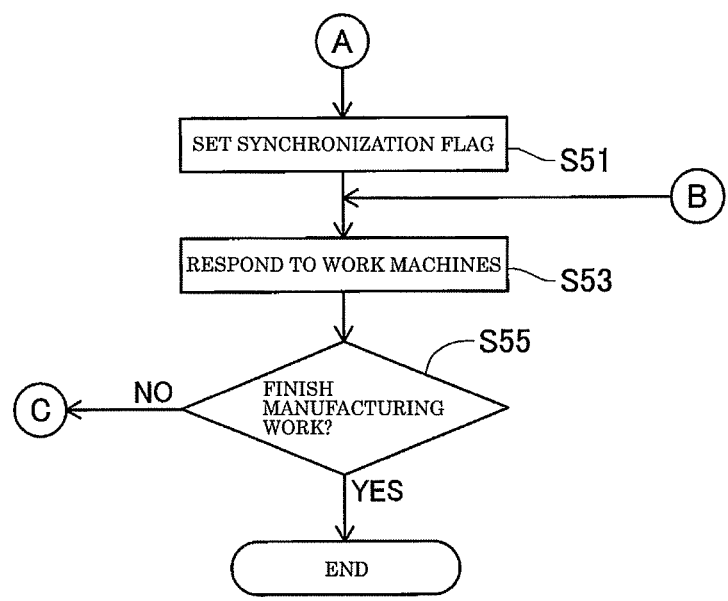
FIG. 6 is a flowchart that shows the quality data saving process by the line management device.

In FIG. 6, after performing the response process to a work machine (S53), the CPU 45 determines whether or not the manufacturing work of mounting boards is finished (S55). In a case in which the manufacturing work is finished (S55: YES), the CPU 45 finishes the process shown in FIGS. 5 and 6. Meanwhile, in a case in which the manufacturing of mounting boards is not finished (S55: NO), the processes from S41 in FIG. 5 are performed again. Additionally, in a case in which it is not possible to upload to the centralized management apparatus 13 due to a communication failure in the wide area network WAN and the process is finished in a state in which the quality data D4, and the like is temporarily saved, it is preferable that the CPU 45 notify a user by displaying this fact on a display screen, or the like, of the line management device 26. As a result of this, it is possible for a user to check the display screen, or the like, manipulate the line management device 26, and perform a suitable countermeasure such as uploading the quality data D4 after the repair of communication.

In addition, in S45 of FIG. 5, in a case in which it is determined that communication with the centralized management apparatus 13 is effective on the basis of the connection flag FG1 (S45: NO), the CPU 45 determines whether or not a synchronization process is required on the basis of the synchronization flag FG2 (S61). In a case in which a value that shows that there is data to be synchronized is set as the synchronization flag FG2 (S61: YES), the CPU 45 starts a synchronization process of S63 and the subsequent steps. Meanwhile, in a case in which it is determined, on the basis of the synchronization flag FG2, that a synchronization process is unnecessary (S61: NO), the CPU 45 performs the processes from S47, and performs a process on reception data from a work machine.

Next, when the synchronization process of S63 is started, the CPU 45 sends data to be updated (the quality data D4, or the like) to the centralized management apparatus 13. After transmission is completed, the CPU 45 determines whether or not there is a response, from the centralized management apparatus 13, indicating that update of the database is completed, that is, whether or not the synchronization process is completed (S65).

For example, in a case in which a communication failure occurs in the wide area network WAN during an update process, the CPU 45 determines that synchronization process is not complete due to there not being a response, from the centralized management apparatus 13, indicating that update is completed (S65: NO). Alternatively, in a case in which an update process is implemented by the line management device 36 of the manufacturing line 11B, in order to ensure consistency of the database, the centralized management apparatus 13 responds, to the line management device 26, indicating that update was not possible. In this case, the CPU 45 determines that the synchronization process is not complete (S65: NO).

In a case in which it is determined, that the synchronization process is not complete (S65: NO), the CPU 45 performs the processes from S47, and performs a process on reception data from a work machine. Meanwhile, in a case in which it is determined that the synchronization process is completed (S65: YES) the CPU 45 sets a value indicating that there is not data to be synchronized as the synchronization flag FG2 (S67), and in S53 of FIG. 6, responds, to a work machine from which data (the quality data D4, or the like) was received in S43 of FIG. 5, indicating that the synchronization process is completed. Further, the CPU 45 performs the processes from S55 in FIG. 6. In this manner, the line management device 26 performs a countermeasure process to a communication failure of the wide area network WAN during manufacturing of mounting boards.

Incidentally, the screen printers 22 and 32, the mounting machines 23 and 33, the inspectors 24 and 34, and the reflow machines 25 and 35 are merely examples of work machines. The local network LAN is an example of a first network. The wide area network WAN is an example of a second network. The process of S15 in FIG. 3 is an example of a control data acquisition process. The process of S33 in FIG. 4 is an example of a work continuance process. The process of S28 in FIG. 4 is an example of a communication disconnection process. The process of S47 in FIG. 5 is an example of a quality data saving process. The process of S61 in FIG. 5 is an example of first and second quality data transmission processes. The process of S65 in FIG. 5 is an example of a transmission completion confirmation process.

The following effects are exhibited according to the present embodiment described in detail above.

<Effect 1> When completion of the activation of all of the work machines (the screen printer 22, and the like) of the manufacturing line 11A is detected (S11: YES in FIG. 3), the line management device 26 reports, to the centralized management apparatus 13, indicating that the manufacturing line 11A is in a state in which it is possible to start manufacturing (S13). The line management device 26 acquires, from the centralized management apparatus 13, material data D1 and control data D2 required in one day of manufacturing of the manufacturing line 11A, and saves the data in the memory section 49 (S17). Further, in a case in which a failure in the wide area network WAN that connects the line management device 26 and the centralized management apparatus 13 is detected (S25: YES in FIG. 4), the line management device 26 causes the manufacturing work of mounting boards by a work machine to be continued on the basis of the control data D2, and the like, corresponding to one day, which is saved in the memory section 49 in advance (S33). As a result of this, in the manufacturing system 10 of the present embodiment, it is possible to continue a manufacturing work in a case in which a failure occurs in the communication with the centralized management apparatus 13.

<Effect 2> In a case in which there is a query, from a work machine (the mounting machines 23, or the like) of the manufacturing line 11A, indicating that the sending and receiving of data is desired (S41: YES in FIG. 5), the CPU 45 of the line management device 26 starts a process that receives data from the work machine (S43). In a case in which there is quality data D4 among reception data is saved (S49: YES), the CPU 45 sets a suitable value as the synchronization flag FG2 (S51 in FIG. 6). Further, in a case in which communication of the wide area network WAN is effective (S45: NO), the CPU 45 performs the synchronization process of S63 and the subsequent steps on the basis of the synchronization flag FG2 (S61: YES), and sends the quality data D4 to the centralized management apparatus 13.

Meanwhile, in a case in which a failure of the wide area network WAN is detected (S45: YES), the CPU 45 temporarily saves the quality data D4 in the memory section 49 (S47). Further, after repair of the wide area network WAN (S45: NO), the CPU 45 sends the quality data D4 accumulated in the memory section 49 during the failure to the centralized management apparatus (S61, etc.). After transmission is completed, the CPU 45 determines whether or not the synchronization process with the centralized management apparatus 13 is completed (S65). As a result of this, it is possible to more reliably save the quality data D4 generated during the occurrence of a failure in the wide area network WAN in the centralized management apparatus 13.

<Effect 3> When it is determined that it is not possible for communication with the centralized management apparatus 13 to be established normally (S25: NO in FIG. 4), the CPU 45 performs a process of disconnecting communication such as closing a communication port used in communication with the centralized management apparatus 13 (S28). As a result of this, it is possible to prevent the reception of unintended data via the wide area network WAN.

Additionally, the present disclosure is not necessarily limited to the above-mentioned embodiment, and naturally, various improvements and alterations can be made within a range that does not depart from the gist of the present disclosure. For example, in the above-mentioned embodiment, the manufacturing system 10 may have a configuration that does not upload the quality data D4 to the centralized management apparatus 13 from the line management device 26. In such a configuration, it is also possible for the line management device 26 to continue a manufacturing work during a communication failure of the wide area network WAN by acquiring the control data D2 from the centralized management apparatus 13 in advance.

In addition, in a case in which a failure of the wide area network WAN is detected, the line management device 26 need not necessarily close a communication port (communication disconnection process). In addition, in the above-mentioned embodiment, the line management device 26, which saves the material data D1 and the control data D2 may be provided as a separate individual device to the work machines (the screen printer 22, the mounting machines 23, the inspector 24, the reflow machine 25, and the like). For example, the line management device 26 and the screen printer 22 may be provided as a single device. In this case, the screen printer 22 may manage the material data D1 and the control data D2 corresponding to one day of each work machine of the manufacturing line 11A. Alternatively, each work machine may save the material data D1 and the control data D2 corresponding to one day that is required its own work. In this case, each work machine can continue a manufacturing work on the basis of the control data D2, and the like, saved in itself during a failure of the wide area network WAN.

In addition, the above-mentioned flowcharts that are shown in FIGS. 4 to 6 are merely examples, and additions and alterations of the content, alterations in order, and the like, may implemented as appropriate. For example, in the above-mentioned embodiment, the line management device 26 acquires the material data D1 and the control data D2 corresponding to one day from the centralized management apparatus 13 after activation is completed, but the embodiment is not limited to this configuration. For example, the line management device 26 may acquire the material data D1, and the like, corresponding to the following day from the centralized management apparatus 13 at a point in time at which all of the works of a current day are finished. In addition, the network configurations of the above-mentioned wide area network WAN and local network LAN are merely examples, and can be altered as appropriate. For example, the centralized management apparatus 13, the line management device 26, the screen printer 22, and the like, may be configured to be connected by using the same or a different local network. In addition, the wide area network WAN and the local network LAN are not limited to wired communication, and a portion or all of the networks may use wireless communication.

In addition, in the above-mentioned embodiment, the mounting board manufacturing system 10 that mounts electronic components on circuit boards was described as an example of the manufacturing system of the present application, but the present disclosure is not limited to this configuration, and for example, may also be applied to a manufacturing system that uses a work robot for implementing an assembly work of a secondary battery (a solar cell, a fuel cell, or the like), or the like.

REFERENCE SIGNS LIST

10: mounting board manufacturing system, 11A, 11B: manufacturing line, 13: centralized management apparatus, 22, 32: screen printer, 23, 33: mounting machine, 24, 34: inspector, 25, 35: reflow machine, 26, 36: line management device, D1: material data, D2: control data, D3: production planning data, D4: quality data, LAN: local network, WAN: wide area network

The invention claimed is:

1. A manufacturing system comprising:
a work machine that implements work on a workpiece to be conveyed on a manufacturing line;
a line management device that is connected to the work machine via a first network, saves control data for controlling the work machine, and transmits the control data to the work machine via the first network; and
a centralized management apparatus that is connected to the line management device via a second network and manages the line management device,
wherein the line management device performs a control data acquisition process of acquiring, from the centralized management apparatus, a plurality of items of control data corresponding to a plurality of types of the workpieces, a work continuance process of causing work of the work machine on the workpiece to be continued on the basis of each of the plurality of items of control data acquired from the centralized management apparatus in a case in which a failure in the second network is detected, a first quality data transmission process of acquiring, from the work machine, quality data, which is generated in accordance with implementation of the work on the workpiece in the work machine, via the first network, and transmitting the quality data to the centralized management apparatus via the second network, a quality data saving process of temporarily saving the quality data in a case in which a disturbance in the second network is detected, a second quality data transmission process of transmitting the temporarily saved quality data to the centralized management apparatus in a case in which repair of a disturbance in the second network is detected, and a transmission completion confirmation process of determining whether or not transmission of the quality data is completed.

2. The manufacturing system according to claim 1, wherein the line management device performs a communication disconnection process of disconnecting communication with the centralized management apparatus via the second network in a case in which a disturbance in the second network is detected.

3. A control method of a manufacturing system provided with a work machine that implements work on a workpiece to be conveyed on a manufacturing line, a line management device that is connected to the work machine via a first network, saves control data for controlling the work machine, and transmits the control data to the work machine via the first network, and a centralized management apparatus that is connected to the line management device via a second network and manages the line management device, the method comprising:

a control data acquisition step of acquiring, by the line management device from the centralized management apparatus, a plurality of items of control data corresponding to a plurality of types of the workpieces;

a work continuance step of causing work of the work machine on the workpiece to be continued on the basis of each of the plurality of items of control data acquired from the centralized management apparatus in a case in which a failure in the second network is detected;

a first quality data transmission process of acquiring, from the work machine, quality data, which is generated in accordance with implementation of the work on the workpiece in the work machine, via the first network, and transmitting the quality data to the centralized management apparatus via the second network;

a quality data saving step of temporarily saving the quality data in a case in which a disturbance in the second network is detected;

a second quality data transmission step of transmitting the temporarily saved quality data to the centralized management apparatus in a case in which repair of a disturbance in the second network is detected; and a transmission completion confirmation step of determining whether or not transmission of the quality data is completed.

4. The control method of manufacturing system according to claim 3, wherein the line management device performs a communication disconnection step of disconnecting communication with the centralized management apparatus via the second network in a case in which a disturbance in the second network is detected.

* * * * *